United States Patent
Chou et al.

(10) Patent No.: US 6,706,166 B2
(45) Date of Patent: Mar. 16, 2004

(54) METHOD FOR IMPROVING AN ELECTRODEPOSITION PROCESS THROUGH USE OF A MULTI-ELECTRODE ASSEMBLY

(75) Inventors: Shih-Wei Chou, Taipei (TW); Ming-Hsing Tsai, Taipei (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 0 days.

(21) Appl. No.: 10/139,975

(22) Filed: May 6, 2002

(65) Prior Publication Data

US 2003/0205477 A1 Nov. 6, 2003

(51) Int. Cl.⁷ .................................................. C25D 5/00
(52) U.S. Cl. ........................... 205/96; 205/87; 205/157; 205/220; 205/221; 205/223; 205/292; 205/640; 205/656; 205/659
(58) Field of Search .......................... 205/87, 157, 123, 205/220, 221, 223, 291, 292, 640, 656, 659, 96

(56) References Cited

U.S. PATENT DOCUMENTS 4,445,980 A * 5/1984 Smith ........................ 205/103
4,466,864 A * 8/1984 Bacon et al. ................ 205/105

* cited by examiner

*Primary Examiner*—Wesley A. Nicolas
(74) *Attorney, Agent, or Firm*—Tung & Associates

(57) ABSTRACT

A method for improving an electrodeposited metal film uniformity and preventing metal deposition and peeling of deposited metal from an electrode during an electrodeposition and electropolishing process including providing a first anode electrode assembly and a semiconductor wafer plating surface disposed in an electrolyte bath including a plating metal for deposition onto the semiconductor wafer plating surface; providing at least one additional anode electrode assembly including the plating metal disposed peripheral to the first anode electrode assembly for selectively applying the cathodic electrical potential during an electropolishing process; and, periodically alternating between an electrodeposition process and electropolishing process with respect to the semiconductor wafer plating surface such that the plating metal is preferentially plated onto the at least one additional electrode assembly.

16 Claims, 2 Drawing Sheets

METHOD FOR IMPROVING AN ELECTRODEPOSITION PROCESS THROUGH USE OF A MULTI-ELECTRODE ASSEMBLY

FIELD OF THE INVENTION

This invention generally relates to metallic electrodeposition and more particularly to a method of improving an electrodeposition process through use of a multi-electrode assembly allowing in-situ contact cleaning and reduction of particulate contamination in the electrolyte, the method and multi-electrode assembly particularly useful for semiconductor wafer electrodeposition processes.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers may be accomplished using various fabrication techniques including oxidation, implantation, deposition, epitaxial growth of silicon, lithography, etching, and planarization.

Sub-micron multi-level metallization is one of the key technologies for the next generation of ultra large scale integration (ULSI). The multilevel interconnects that lie at the heart of this technology require planarization of interconnect features formed in high aspect ratio apertures, including contacts, vias, metal interconnect lines and other features. Reliable formation of these interconnect features is very important to the success of ULSI and to the continued effort to increase circuit density and quality on individual substrates and die.

Copper and copper alloys have become the metal of choice for filling sub-micron, high aspect ratio interconnect features on semiconductor substrates. Copper and its alloys have lower resistivity and higher electromigration resistance compared to other metals such as, for example, aluminum. These characteristics are critical for achieving higher current densities increased device speed.

As circuit densities increase, the widths of vias, contacts, metal interconnect lines, and other features, decrease to sub-micron dimensions, whereas the thickness of the dielectric layers, through the use low-k (low dielectric constant) materials, has remained substantially constant. Consequently, the aspect ratios for the features, i.e., their height divided by width, has increased thereby creating additional challenges in adequately filling the sub-micron features with, for example, copper metal. Many traditional deposition processes such as chemical vapor deposition (CVD) have difficulty filling increasingly high aspect ratio features, for example, where the aspect ratio exceeds 2:1, and particularly where it exceeds 4:1.

As a result of these process limitations, electroplating or electrodeposition, which has previously been limited to the fabrication of patterns on circuit boards, is now emerging as a preferable method for filling metal interconnects structures such as via openings (holes) and trench line openings on semiconductor devices. Typically, electroplating uses a suspension of positively charged ions of deposition material, for example metal ions, in contact with a negatively charged substrate, as a source of electrons, to deposit (plate out) the metal ions onto the charged substrate, for example, a semiconductor wafer. A thin metal layer (seed layer) is first deposited on the semiconductor wafer and in etched features to provide an electrical path across the surfaces. An electrical current is supplied to the seed layer whereby the semiconductor wafer surface is electroplated with an appropriate metal, for example, aluminum or copper.

One exemplary process for forming a series of interconnected multiple layers, for example, is a damascene process. Although there are several different manufacturing methods for manufacturing damascene structures, all such methods employ a series of photolithographic masking and etching steps, typically by a reactive ion etch (RIE). In the typical multilayer semiconductor manufacturing process, for example, a series insulating layers are deposited to include a series of interconnecting metallization structures such as vias and metal line interconnects to electrically interconnect areas within the multilayer device and contact layers to interconnect the various devices on the chip surface. In most devices, pluralities of vias are separated from one another along the semiconductor wafer and selectively interconnect conductive regions between layers of a multi layer device. Metal interconnect lines typically serve to selectively interconnect conductive regions within a layer of a multilayer device. Vias and metal interconnect lines are selectively interconnected in order to form the necessary electrical connections.

In filling the via openings and trench line openings with metal, for example, copper, electroplating is a preferable method to achieve superior step coverage of sub-micron etched features. The method generally includes first depositing a barrier layer over the etched opening surfaces, such as via openings and trench line openings, depositing a metal seed layer, preferably copper, over the barrier layer, and then electroplating a metal, for example copper, over the seed layer to fill the etched features to form, for example, vias and trench lines. Finally, the deposited layers and the dielectric layers are planarized, for example, by chemical mechanical polishing (CMP), to define a conductive interconnect feature.

Metal electroplating (electrodeposition) in general is a well-known art and can be achieved by a variety of techniques. Common designs of cells for electroplating a metal on semiconductor wafers involve positioning the plating surface of the semiconductor wafer within an electrolyte solution including an anode with the electrolyte impinging perpendicularly on the plating surface. The plating surface is contacted with an electrical power source forming the cathode of the plating system such that ions in the plating solution deposit on the conductive portion of the plating surface.

For example, referring to FIG. 1A is shown a cross sectional representation of the relationship of an anode assembly 12 to a semiconductor wafer in a typical electroplating (electrodeposition). The anode assembly 12, includes an anode 14, for example, formed of copper or an alloy thereof for copper electroplating. The anode 14, is surrounded by a titanium top plate, 16A and a titanium bottom plate 16B. An anode pad 18 covers the titanium top plate for directing an electrolytic current flow indicated by directional arrows 20A to the semiconductor wafer 22 for electroplating, for example, copper, onto the semiconductor wafer surface 22A.

During the electroplating process the applied potential may be reversed in sign periodically during the deposition process causing an electropolishing process to occur at the semiconductor wafer surface 22A of already electrodeposited copper including at the electrical contacts (not shown) made to the wafer thereby cleaning the same.

Referring to FIG. 1B, upon changing the sign of the applied potential causing current reversal in the anode assembly 12, the current flow direction of the electrolyte, indicated for example by directional arrows 20B, carries the electrolyte, including for example, copper ions to make contact with the titanium plates, for example titanium top plate 16A, where it is electrodeposited for example, at top plate surface 17.

One problem with the prior art electrodeposition method is that the adhesion of differing metals, for example the copper plating on the titanium surface during current (electrical potential) reversal steps is poor. As a result, the copper plating will tend to peel after a time period becoming dislodged and accumulating in the electrolyte bath thereby producing defective electroplating coatings on the semiconductor wafer, for example, including electroplated copper particles. Further, the electroplating film uniformity suffers over time due to the particulate contamination. For example, referring to FIG. 2, the electroplating film thickness in thousands of Angstroms is represented on the vertical axis while a relative position on an electroplated film is represented on the horizontal axis. Line A represents an electroplating process carried out for about 180 seconds and line B represents an electroplating process carried for about 90 seconds. In comparison, line C represents the thickness of a seed layer. It is evident that the electroplating film represented by line A carried out for the longest period shows a greater variation in film thickness and consequently has poorer uniformity believed to be due to particulate contamination accumulation. Consequently, semiconductor wafer yield is reduced and throughput is reduced by the need for filtering maintenance of the electrolyte solution.

These and other shortcomings demonstrate a need in the semiconductor processing art to develop a method for electrodeposition whereby metal plating deposition on a dissimilar metal surface included in an anode is reduced or avoided thereby minimizing particulate contamination.

It is therefore an object of the invention to provide a method for electrodeposition whereby metal plating deposition on a dissimilar metal surface included in an anode is reduced or avoided thereby minimizing particulate contamination while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for improving a electrodeposited metal film uniformity and preventing metal deposition and peeling of deposited metal from an electrode during an electrodeposition and electropolishing process.

In a first embodiment according to the present invention, the method includes providing a first anode electrode assembly and a semiconductor wafer plating surface disposed in an electrolyte bath comprising a plating metal for deposition onto the semiconductor wafer plating surface; providing at least one additional anode electrode assembly comprising the plating metal disposed peripheral to the first anode electrode assembly for selectively applying the cathodic electrical potential during an electropolishing process; and, periodically alternating between an electrodeposition process and electropolishing process with respect to the semiconductor wafer plating surface such that the plating metal is preferentially plated onto the at least one additional electrode assembly.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIGS. 3A and 3B are conceptual cross sectional side view representations of an electrode assembly arrangement and electrolyte flow according to the present invention.

DETAILED DESCRIPTION OF THE PREFERRED EMBODIMENTS

In the method and apparatus according to the present invention, the invention is explained by reference to electroplating of copper on a titanium surface of an exemplary copper anode assembly. It will be appreciated, however, that the method and apparatus of the present invention may be advantageously applied to the electroplating of any metal onto any electrode surface where electroplated coatings are produced as a result of periodic changes in electrical potential causing a change from an electrodeposition process to an electropolishing process. For example, the anode may include other metals or may be coated with other metals such as Ta, nitrides of tantalum, gold, rhodium, and titanium nitride with Ti overlay.

During the electroplating (electrodeposition) process according to the present invention, the applied potential may be reversed in sign periodically during the deposition process to cause an electropolishing process to occur at the surface of already electrodeposited copper, for example a semiconductor wafer, including at the electrical contacts made to the wafer thereby cleaning the same in-situ. The periodic electropolishing process improves the lifetime of the electrical contacts contacting the semiconductor wafer surface typically including spring or finger like contacts. In addition, metal plating residue, for example copper, which tends to accumulate at preferentially charged areas on the semiconductor wafer surface such as high points including surface scratches, is reduced.

It has been found according to the method and apparatus of the present invention that the addition of at least one additional electrode assembly, for example, a third electrode assembly that is activated by having an electrical potential applied between the third electrode and the semiconductor substrate (second electrode assembly), during the period of electrolyte current reversal (potential reversal), avoids or reduces the deposition of copper onto the anode (first electrode assembly), for example, titanium plates covering a copper anode by diverting the electrolyte to the third electrode assembly for deposition on a similar metal, for example, copper. As a result, peeling, of electroplated copper from the first electrode assembly which poorly adheres to the dissimilar titanium metal, is avoided thereby avoiding particulate contamination of the electrolyte bath.

Figure 1A:
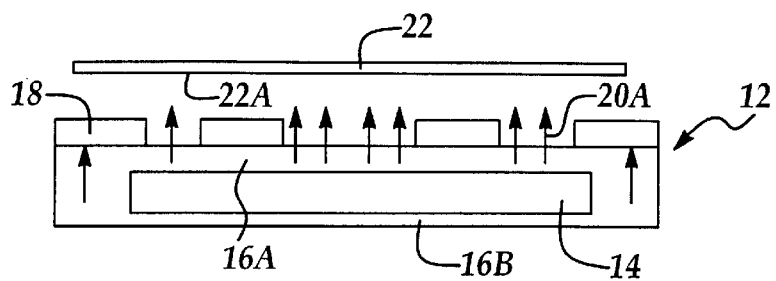
FIGS. 1A and 1B are conceptual cross sectional side view representations of an electrode assembly arrangement and electrolyte flow according to the prior art.
Figure 1B:
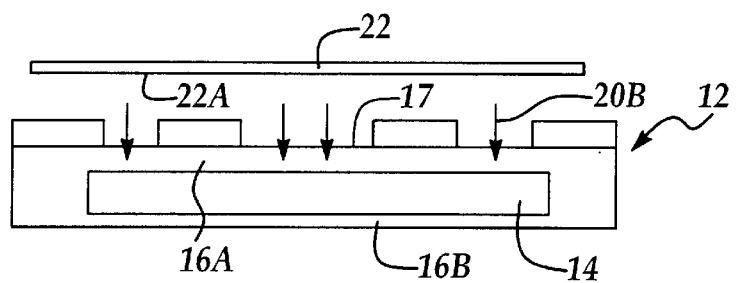
Figure 2:
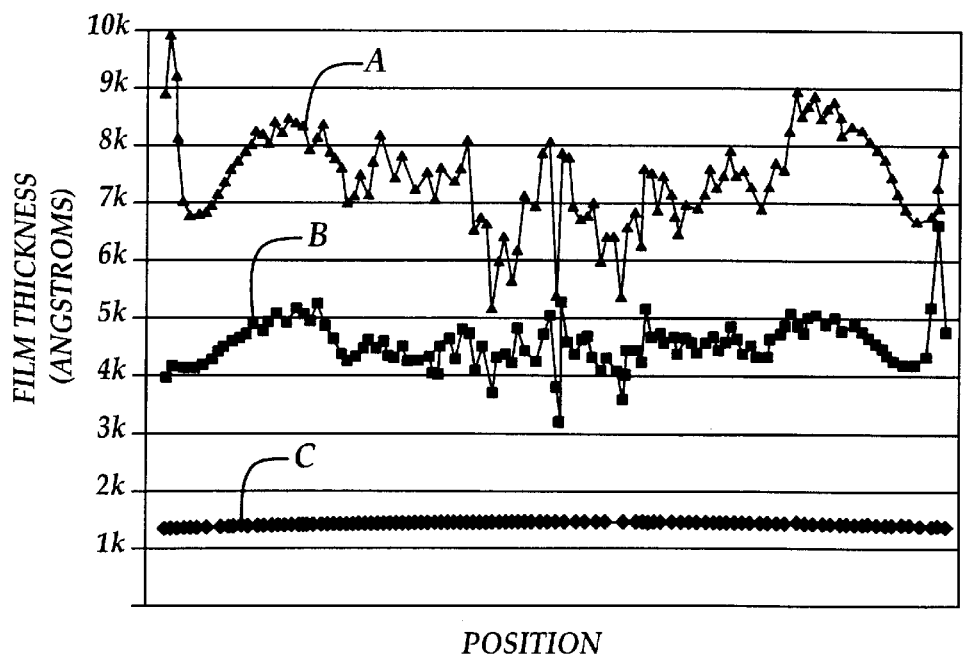
FIG. 2 is a representation of data including film thickness of electrodeposited films, including a seed film versus position according to the prior art.
Figure 3A:
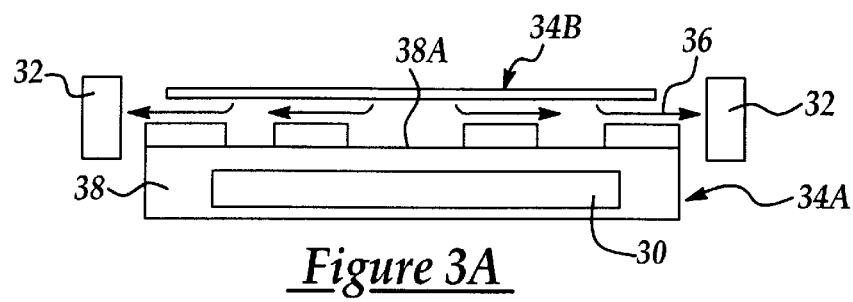
Figure 3A:
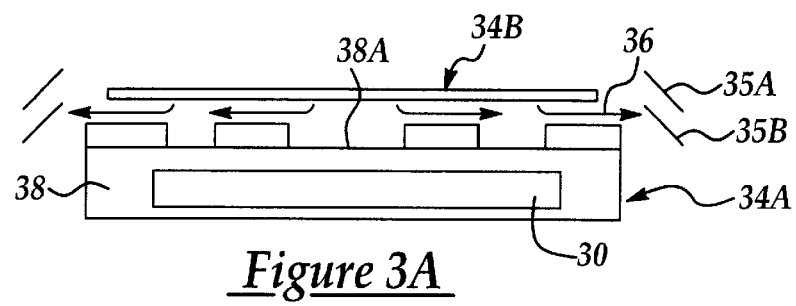

For example, referring to FIG. 3A is shown a schematic cross sectional representation of the operational effect of one embodiment of the present invention where at least one additional electrode, e.g., a third electrode, e.g. 32, is included in an electrode assembly arrangement, e.g., first electrode assembly 34A (anodic assembly) and second electrode assembly 34B (e.g., semiconductor wafer cathode assembly) such that the potential charge applied to the semiconductor wafer electrode assembly 34B is periodically changed such that an electrical potential difference is applied between the semiconductor wafer assembly 34B and the third electrode 32 causing a corresponding current flow reversal including electrolyte flow from the second electrode assembly 34B in the direction of the third electrode assembly) e.g., 32, as conceptually indicated by directional arrows e.g., 36. Consequently, metal in the electrolyte solution, for example, copper, is preferentially plated onto the third electrode e.g., 32, rather than onto the metal substrate covered anode, for example titanium plate 38 covering copper anode 30. Advantageously, metal plating accumulation on the anodic assembly 34A is reduced, thereby reducing the accumulation of peeled off particulates in the electrolyte solution. The at least one additional electrode assembly 32 (e.g., third electrode assembly) is preferably disposed to surround the anodic assembly 34A, for example, disposed around the periphery of anodic assembly 34A such that it may advantageously divert an electrolyte current flow to the third (additional) electrode assembly 32 upon the application of an electrical potential between the third electrode assembly 32 and the semiconductor wafer assembly 34B.

In operation, the at least one additional electrode assembly, for example the third electrode assembly 32, is preferably at a different electrical potential than the first electrode assembly 34A metal plating surface, for example titanium plating surface 38A. It will be appreciated that the electrical potential of the additional electrode assembly (e.g., 32) will depend on electrical potential applied by a power source, which may be from the same or different power source as the first electrode assembly 34A as further explained in additional embodiments below.

Preferably, the electrical potential difference is sufficient to substantially divert the electrolyte flow preferentially to the third electrode assembly 32 for electroplating the metal containing electrolyte onto the third electrode assembly 32. It will be further appreciated that the optimal positioning of the third (additional) electrode assembly 32 in relationship to the first electrode assembly 34A, for example at the periphery of the first electrode assembly 34A, will depend on several variables including the applied potential, the electrolyte solution, and the redox potentials of the cathode and anodic materials in use.

It will be appreciated that shape of the surface of the at least one additional electrode assembly may be a variety of shapes including spherical, hemispherical, conical, rectangular, and the like, as long as additional electrode assembly is able to exert an electric field sufficient over a sufficient area to attract a metal containing electrolyte flow away from, for example, parallel facing first electrode and second electrode assemblies, and provide a surface for preferential plating with good adhesion of the diverted electrolyte. In this respect, preferably a ring shaped additional electrode is positioned at the periphery of the first and second electrodes to divert an electrolyte flow for electroplating onto the additional electrode, the additional electrode preferably being formed of the same metal as that contained in the electrolyte for metal plating. For example, the additional electrode assembly is preferably located at the periphery of the first electrode assembly and/or the second electrode assembly. Further, the at least one additional electrode assembly may include, for example two or more electrodes. e.g., 35A, 35B as shown in FIG. 3B with each of the additional electrode assemblies optionally arranged to operate at a different electrical potential, for example, the additional electrode assembly 35B at a further distance from the second electrode assembly having a larger applied potential to exert a larger electrode field strength.

Figure 4A:
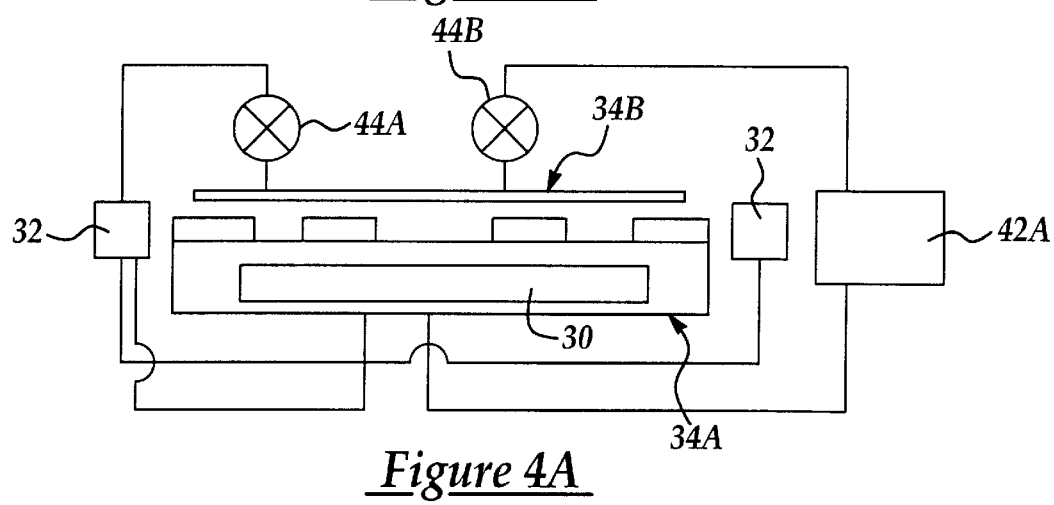
FIGS. 4A and 4B are representations of the electrical circuit corresponding to the electrode assembly arrangement according to different embodiments of the present invention.

In another embodiment, the at least one additional electrode assembly for diverting an electrolyte current, for example a third electrode assembly, may include at least one additional power supply for controlling a potential of the at least one additional electrode assembly for diverting an electrolyte current. Referring to FIG. 4A is shown a cross sectional representation of the electrodeposition electrode assembly including a schematic representation of an exemplary circuit including the at least one additional electrode. In one embodiment, the at least one additional electrode assembly, e.g., 32 shares the same power supply e.g., 42A as the first electrode assembly 34A as shown in FIG. 4A. The second electrode assembly, for example, semiconductor wafer 34B, preferably includes switches, e.g., 44A and 44B for controlling a potential applied to semiconductor wafer 34B. For example, in operation, during an electroplating process, switch 44A is opened to deactivate the additional electrode assembly 32 (remove the applied electrical potential), while switch 44B is closed to apply an electrical potential between anode assembly 34A (first electrode assembly) and semiconductor wafer 34B for electroplating. Periodically, to carry out an electropolishing or electroetching process, the electrical potential applied to semiconductor wafer 34B is reversed in charge (e.g. positive to negative) switch 44B being opened while switch 44A is closed to activate the additional electrode assembly 32 to create a potential difference between the second electrode assembly 34B and the additional electrode assembly 32 to attract an electrolyte flow to the additional electrode assembly 32 for deposition.

Figure 4B:
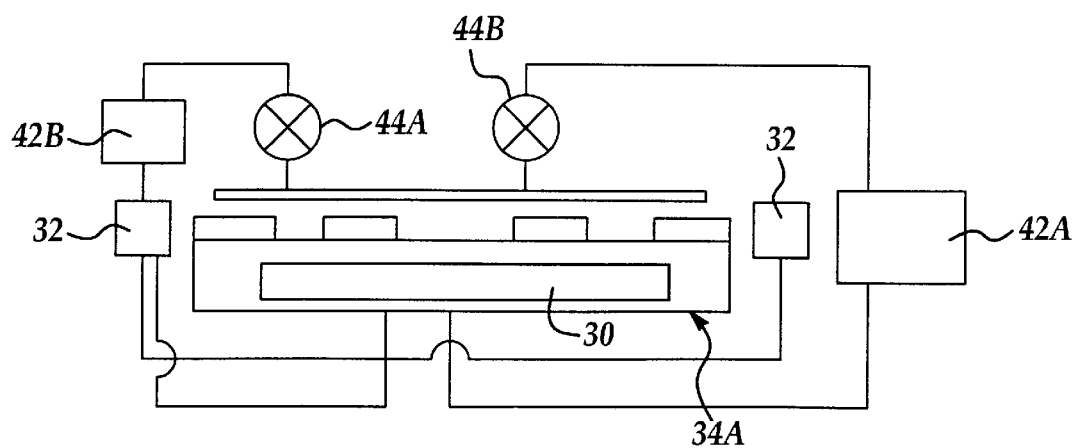

In another embodiment, referring to FIG. 4B, at least one additional power supply e.g., 42B is included to power the at least one additional electrode assembly 32 to control the relative potentials applied between the second electrode assembly, e.g., semiconductor wafer 34B, and at least one of the first electrode assembly 34A and the at least one additional electrode assembly 32.

In operation, for example, of the at least one additional electrode 32, the at least one additional electrode 32 is inactive during an electroplating process where an electrolyte current is flowing, for example, from the first electrode assembly 34A (e.g., anode assembly) to the second electrode assembly 34B(e.g., semiconductor wafer cathode). During the electroplating process, the at least one additional electrode 32 is rendered inactive, for example, by selectively opening switch 44A. When the electrolyte current is reversed, for example by reversing the charge of the applied electrical potential for an electropolishing or electroetching step, the at least one additional electrode 32, for example a third electrode assembly, becomes active by having a potential applied by closing switch 44A. In the embodiment where the additional power supply 42B is included, both the first electrode assembly and additional electrode assembly may optionally remain active at different applied potentials by having, for example, both switches 44A and 44B closed.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for improving a electrodeposited metal film uniformity and preventing metal deposition and peeling of deposited metal from an electrode during an electrodeposition and electropolishing process comprising the steps of:

providing a first anode electrode assembly and a semiconductor wafer plating surface disposed in an electrolyte bath comprising a plating metal for deposition onto the semiconductor wafer plating surface;

providing at least one additional anode electrode assembly comprising the plating metal disposed peripheral to the first anode electrode assembly for selectively applying the cathodic electrical potential during an electropolishing process; and, periodically alternating between an electrodeposition process and electropolishing process with respect to the semiconductor wafer plating surface such that the plating metal is preferentially plated onto the at least one additional electrode assembly.

2. The method of claim 1, wherein the first electrode assembly major surface is disposed facing and substantially parallel to the semiconductor wafer plating.

3. The method of claim 1, wherein the at least one additional anode electrode assembly is powered by a separate power supply.

4. The method of claim 1, wherein the first anode electrode assembly is deactivated during an electropolishing process.

5. The method of claim 1, wherein the electropolishing process is carried out for a sufficient period of time to at least partially clean semiconductor wafer electrode contacts contacting with the semiconductor wafer plating surface.

6. The method of claim 1, wherein electroplating of the plating metal onto the first electrode assembly is avoided.

7. The method of claim 1, wherein the first electrode assembly comprises a copper anode with an overlying titanium plate and the plating metal comprises copper.

8. The method of claim 7, wherein the copper anode comprises an additional material selected from the group consisting of Ta, nitrides of tantalum, gold, rhodium, titanium nitride, and titanium.

9. The method of claim 1, wherein the at least one additional anode electrode assembly consists essentially of the plating metal.

10. The method of claim 1, wherein the anode electrode assembly, the plating, and the at least one additional anode electrode assembly comprise copper.

11. The method of claim 1, wherein the at least one additional electrode assembly is positioned to surround the first electrode assembly.

12. The method of claim 1, wherein the at least one additional anode electrode assembly comprises two anode electrode assemblies arranged at the periphery to surround the first anode electrode assembly.

13. A method for improving an electroplating film uniformity by reducing metal plating accumulation and peeling of plated metal from an electrode assembly during an electrodeposition and electropolishing process comprising the steps of:

providing a first anode electrode assembly and a semiconductor wafer plating surface in contact with electrical contacts for applying a potential disposed in an electrolyte bath comprising a plating metal for deposition onto the semiconductor wafer plating surface;

providing at least one additional anode electrode assembly comprising the plating metal disposed peripheral to and surrounding the first anode electrode assembly for selectively applying a cathodic electrical potential during an electropolishing process; and, periodically alternating between an electrodeposition process and electropolishing process with respect to the semiconductor wafer plating surface wherein the plating metal is preferentially plated onto the at least one additional electrode assembly.

14. A method for improving a copper electroplating film uniformity by reducing copper plating accumulation and peeling of plated copper metal from an anodic electrode assembly during a copper electrodeposition and electropolishing process comprising the steps of:

providing a first anode electrode assembly comprising copper disposed in an electrolyte bath comprising copper for copper deposition onto a semiconductor wafer plating surface;

providing at least one additional anode electrode assembly comprising copper disposed to surround to the first anode electrode assembly for selectively applying a cathodic electrical potential during an electropolishing process; and, periodically reversing an electrolyte current flow to perform an electropolishing process with respect to the semiconductor wafer plating surface such that copper is preferentially plated onto the at least one additional electrode assembly.

15. The method of claim 14, wherein the first electrode assembly comprises a copper anode with an overlying metal plate.

16. The method of claim 15 wherein the overlying metal plate is selected from the group consisting of Ta, nitrides of tantalum, gold, rhodium, titanium nitride and titanium.

* * * * *